(12) United States Patent
Schweizer

(10) Patent No.: US 10,959,347 B2
(45) Date of Patent: Mar. 23, 2021

(54) COMMUNICATION MODULE FOR A COMMUNICATION OR AUTOMATION DEVICE

(71) Applicant: Siemens Aktiengesellschaft, Munich (DE)

(72) Inventor: Urs Schweizer, Malsch-Waldprechtsweier (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 16/771,294

(22) PCT Filed: Nov. 5, 2018

(86) PCT No.: PCT/EP2018/080092
§ 371 (c)(1),
(2) Date: Jun. 10, 2020

(87) PCT Pub. No.: WO2019/115089
PCT Pub. Date: Jun. 20, 2019

(65) Prior Publication Data
US 2020/0383227 A1 Dec. 3, 2020

(30) Foreign Application Priority Data
Dec. 14, 2017 (EP) .................................... 17207333

(51) Int. Cl.
*H01R 13/627* (2006.01)
*H05K 7/14* (2006.01)
(Continued)

(52) U.S. Cl.
CPC ....... *H05K 7/1468* (2013.01); *H01R 13/6215* (2013.01); *H01R 13/631* (2013.01); *H04L 67/12* (2013.01); *H05K 7/1474* (2013.01)

(58) Field of Classification Search
CPC ............... H05K 7/1468; H05K 7/1474; H01R 13/6215; H01R 13/631; H04L 67/12
(Continued)

(56) References Cited

U.S. PATENT DOCUMENTS 4,790,762 A    12/1988 Harms et al.
5,285,355 A    2/1994 Chabert et al.
(Continued)

FOREIGN PATENT DOCUMENTS

DE    2347751    4/1975
DE    69200539   5/1995
(Continued)

OTHER PUBLICATIONS

PCT International Search Report and Written Opinion of International Searching Authority dated Dec. 19, 2018 based on PCT International Application No. PCT/EP2018/080092 filed Nov. 5, 2018.
(Continued)

*Primary Examiner* — Khiem M Nguyen
(74) *Attorney, Agent, or Firm* — Cozen O'Connor

(57) ABSTRACT

A communication module for a communication or automation device includes a housing having a connection region that can be brought into contact with a base module of the communication or automation device, wherein centering pins of the connection region are insertable into corresponding receptacles in the base module, a fastening screw having a threaded section penetrates the housing between the centering pins, where the threaded section of the fastening screw is screwable into a threaded hole in the base module, and a passage for receiving the fastening screw is arranged substantially centrally in the housing and extends at right angles to the connection region, the fastening screw has a driver ring connected to it that surrounds a section of a shaft (Continued)

of the fastening screw and where, along the passage, a cutout is provided in the housing for the driver ring that is axially displaceable inside the cutout.

14 Claims, 4 Drawing Sheets

(51) Int. Cl.
    *H04L 29/08* (2006.01)
    *H01R 13/631* (2006.01)
    *H01R 13/621* (2006.01)

(58) Field of Classification Search
    USPC .................................................. 439/364, 377
    See application file for complete search history.

(56) References Cited

U.S. PATENT DOCUMENTS

| | | | | |
|---|---|---|---|---|
| 5,984,734 | A * | 11/1999 | Piper | H01R 29/00 |
| | | | | 439/715 |
| 9,531,095 | B1 * | 12/2016 | Jiang | H05K 7/1468 |
| 2012/0043378 | A1 * | 2/2012 | Vazach | H05K 7/1468 |
| | | | | 235/375 |
| 2012/0294156 | A1 | 11/2012 | Hack et al. | |

FOREIGN PATENT DOCUMENTS

| | | |
|---|---|---|
| DE | 102010062065 | 5/2012 |
| EP | 0419694 | 4/1991 |
| EP | 2456133 | 5/2012 |
| EP | 2819494 | 12/2014 |

OTHER PUBLICATIONS

EP Search Report dated Jun. 14, 2018 based on EP17207333 filed Dec. 14, 2017.

\* cited by examiner

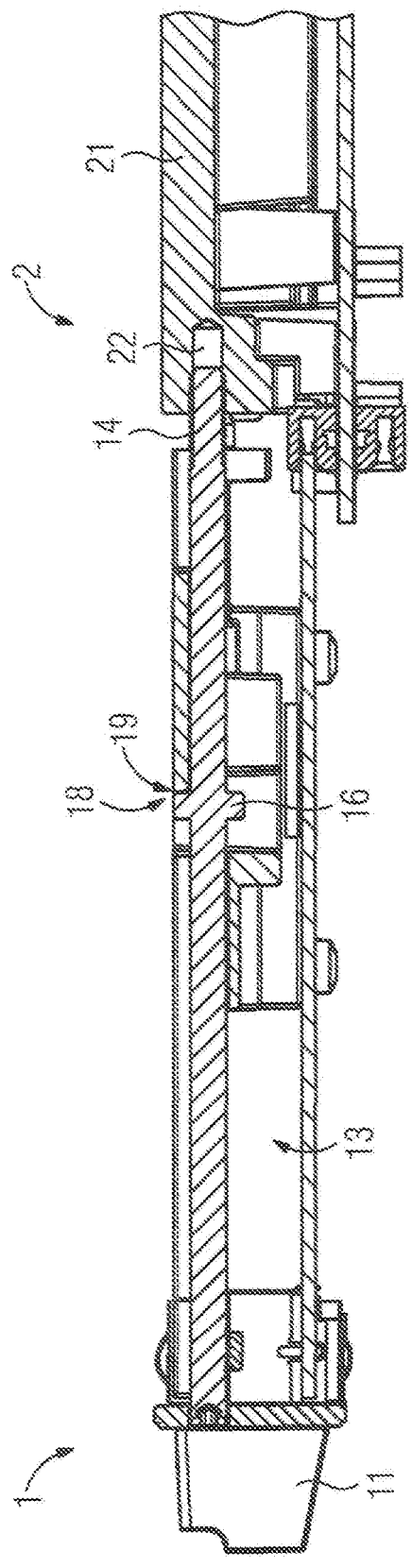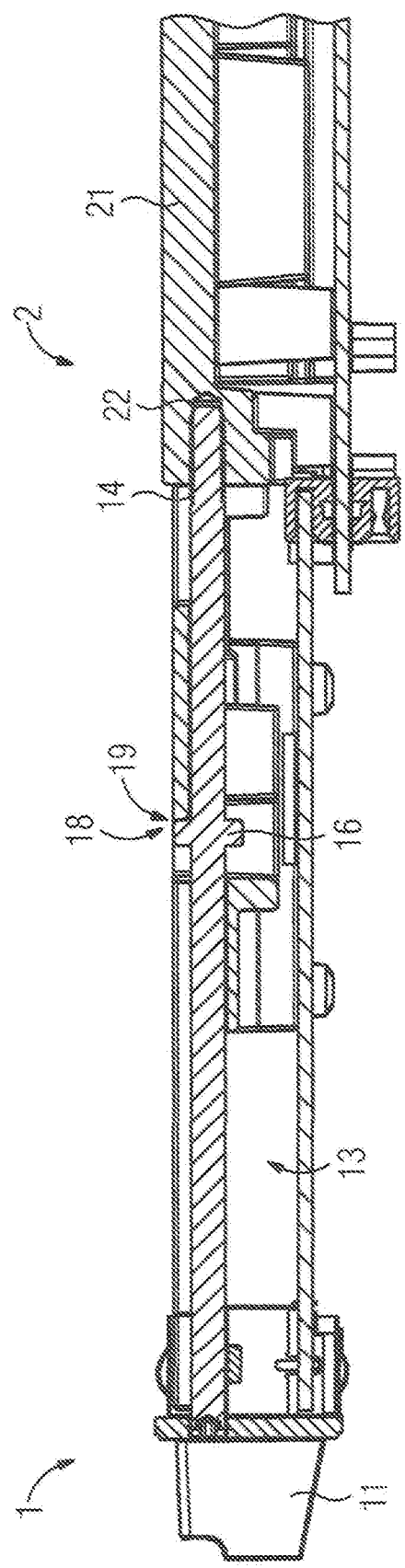

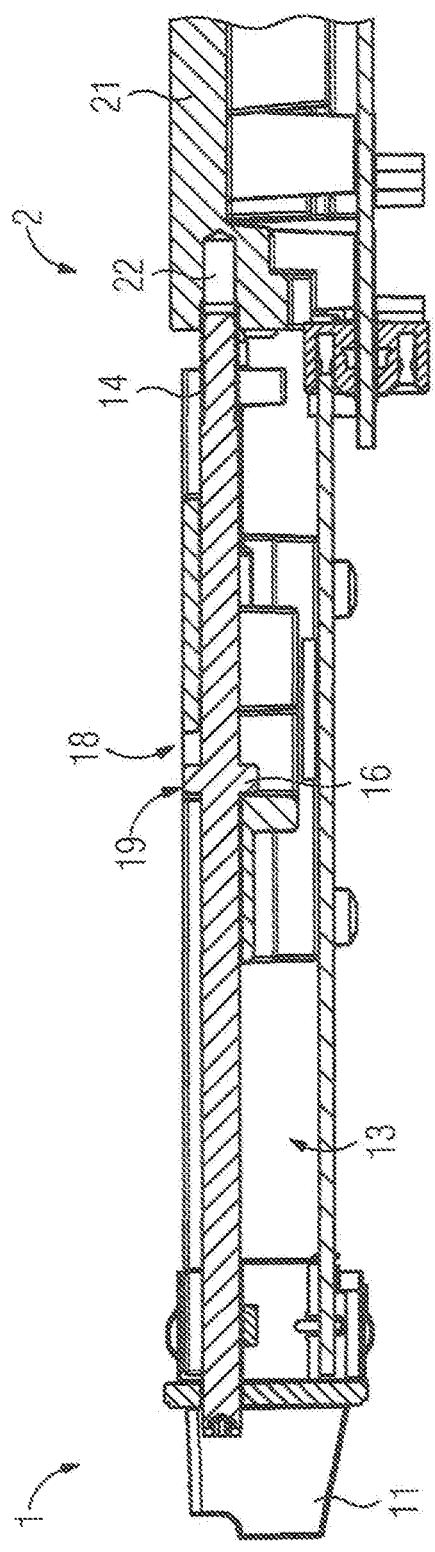

COMMUNICATION MODULE FOR A COMMUNICATION OR AUTOMATION DEVICE

CROSS-REFERENCE TO RELATED APPLICATIONS

This is a U.S. national stage of application No. PCT/EP2018/080092 filed 5 Nov. 2018. Priority is claimed on European Application No. 17207333 filed 14 Dec. 2017, the content of which is incorporated herein by reference in its entirety.

BACKGROUND OF THE INVENTION

1. Field of the Invention

The present invention relates to a communication module for a communication or automation device, wherein the communication module comprises a housing having a connection region that can be brought into contact with a base module of the communication or automation device.

2. Description of the Related Art

Usually, an industrial automation system comprises a large number of communication and automation devices that are linked to one another via an industrial communication network and serve for controlling or regulating installations, machines and/or devices within the scope of manufacturing or process automation. Communication and automation devices include, for example, programmable logic controllers, decentralized peripheral modules, contactors, communication modules, switches and routers. On account of time-critical boundary conditions in technical systems that are automated via industrial automation devices, real-time communication protocols, such as Profinet, Profibus or real-time Ethernet, are predominantly used in industrial communication networks for communication between automation devices.

DE 10 2010 062065 A1 discloses a modular electronics device that comprises an electronic base device, an electronics module for electrical connection to the base device and for mechanical retention on the base device. The electronics module and the base device are configured such that the electronics module can be mechanically coupled to the base device in an attachment position. By virtue of a subsequent pivoting movement, the electronics module can be pivoted into an intermediate position and then moved to a connection position by virtue of a pushing movement. In the connection position, the electronics module is electrically connected to the base device and mechanically fixed to the base device.

DE 692 00 539 T2 relates to a modular electronic unit in which an electronic module is coupled via a housing edge initially to a stop of a module carrier and to a corresponding housing stop on the electronic module. By virtue of a subsequent pivoting movement, the electronic module is moved against a clamping spring that is arranged in the region of the stop to a connection position in which the electronic module and the module carrier are preferably latched to one another.

EP 2 456 133 B1 describes a modular switching network node for an industrial communication network. The modular switching network node comprises a switching network node base unit and at least one port module that has at least one connection interface for coupling to the communication network. The modular switching network node is further designed for transferring communication data, which enters via connection interfaces of the modular switching network node, to at least one further connection interface. Furthermore, a port module can also be exchanged for a functional module for the purpose of expanding functionality.

EP 2 819 494 A relates to a modular communication device for an industrial automation system having a base module and at least one expansion module that can be connected to the base module. The base module and the at least one expansion module have multiple-pole plug-in connection elements that correspond to one another. Centering pins that can each be inserted into a cutout on a slotted locking guide of the base module and can be latched there are provided on the expansion module. The centering pins each have an encircling slot that adjoins a conical head and into each of which a latching element of the slotted locking guide engages in a locked state. The slotted locking guide can be moved perpendicularly to the centering pins from a locking position to an unlocking position in which the latching elements of the slotted locking guide release the grooves of the centering pins.

SUMMARY OF THE INVENTION

It is an object of the present invention to provide a communication module for a communication or automation device that can be connected to a base module of the communication or automation device in a manner that is simple and robust against vibrations and shocks.

This and other objects and advantages are achieved in accordance with the invention by a communication module for a communication or automation device that comprises a housing having a connection region which can be brought into contact with a base module of the communication or automation device. In addition, at least two centering pins are provided in the connection region and can be inserted into corresponding receptacles of the base module. For example, multiple-pole plug-in connection elements can be provided in the connection region, where the plug-in connection elements can be connected to corresponding plug-in connection elements on the base module. The housing of the communication module preferably comprises at least one transmitting and receiving unit that is configured in accordance with a selected physical layer and/or data link layer protocol.

In accordance with the invention, the communication module comprises a fastening screw that passes through the housing between the centering pins via a threaded section. Here, the threaded section of the fastening screw can be screwed into a threaded bore of the base module. Furthermore, a passage for receiving the fastening screw is provided, where the passage is arranged substantially centrally in the housing and extends perpendicularly to the connection region. A driver ring is connected to the fastening screw and surrounds a section of a shaft of the fastening screw. A cutout for the driver ring is provided in the housing along the passage, where the driver ring is axially displaceable inside the cutout.

Plug-in forces that are required when screwing the communication module to the base module by interlocking connection between the driver ring and the housing of the communication module are advantageously transmitted to the housing by means of the driver ring. During removal, the fastening screw is turned in the unscrewing direction, such that the housing of the communication module is moved away from the base module via the driver ring. In this way, tensile forces that are required for removal are realized in a simple manner, and therefore the communication module can be conveniently removed from the base module. In addition, the centering pins and the fastening screw ensure the communication module is correctly and securely fitted and removed. In particular, a compact configuration of the communication module that has only a small number of mechanical components can be realized on account of the arrangement and configuration of the fastening screw, including the driver ring.

In accordance with an advantageous embodiment of the communication module in accordance with the invention, the centering pins each have a conical head. Furthermore, the centering pins can comprise latching elements, so that they can be latched into the corresponding receptacles of the base module.

A knurled wheel for turning the fastening screw is preferably integrally formed on the driver ring. Therefore, the communication module can also be fitted on the base body without tools. The driver ring is advantageously connected in a rotationally fixed manner to the shaft of the fastening screw.

In accordance with a further embodiment of the present invention, axial ends of the cutout each form a stop for the driver ring along the passage. Therefore, in an end position, a stop of the communication module butts in a defined manner against a stop of the base module, where the centering pins of the communication module plug into the corresponding receptacles of the base module in an interlocking manner and render possible mechanically secure connection of the communication module to the base module.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The present invention will be explained in more detail below using an exemplary embodiment with reference to the drawing, in which:

FIG. 3 shows a sectional illustration of the communication module of FIG. 1 and of a base module of the modular communication or automation device during fitting of the communication module, FIG. 4 shows a sectional illustration of the communication module and of the base module in the fitted state of the communication module in accordance with the invention; and FIG. 5 shows a sectional illustration of the communication module and of the base module during removal of the communication module in accordance with the invention.

DETAILED DESCRIPTION OF THE EXEMPLARY EMBODIMENTS

Figure 1:
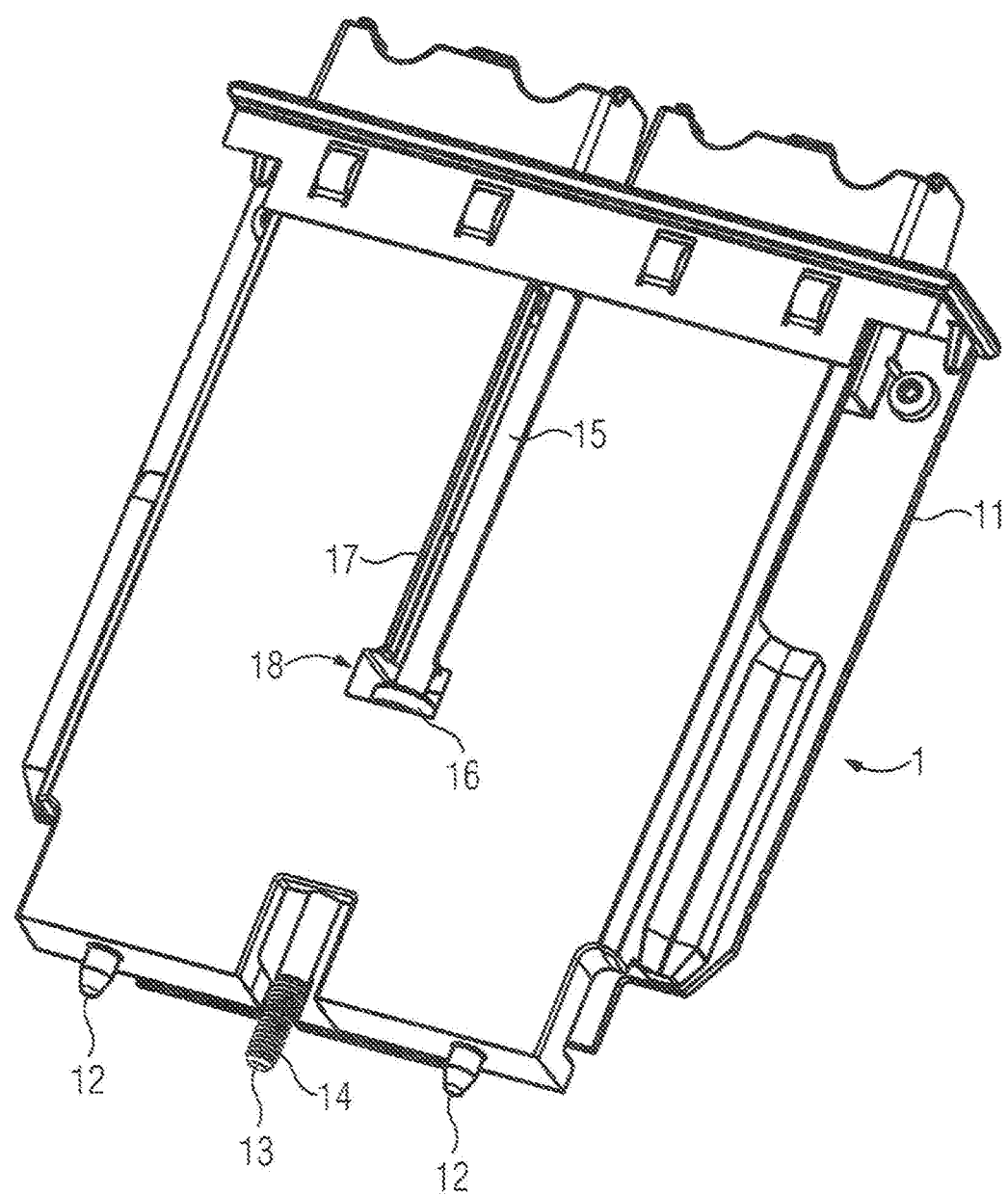
FIG. 1 shows a perspective illustration of a communication module for a modular communication or automation device in accordance with the invention.

The communication module 1 illustrated in FIG. 1 for a modular communication or automation device comprises a housing 11 having a connection region that can be brought into contact with a base module 2 of the communication or automation device (also see FIG. 3). Multiple-pole plug-in connection elements are provided in the connection region and these can be connected to corresponding plug-in connection elements on the base module 2. The communication or automation device can be, for example, a switch for a communication network of an industrial automation system. In the present exemplary embodiment, the housing 11 of the communication module 1 comprises a transmitting and receiving unit with a PHY and a MAC circuit that are configured in accordance with a selected physical layer or data link layer protocol. A switch usually has a plurality of transmitting and receiving units that can each be comprised by a separate communication module and can be connected to one another in a switchable manner via a coupling element. The coupling element can be, in particular, a high-speed bus or a backplane switch with an associated controller.

Two centering pins 12 are provided in the connection region of the communication module 1 and these can be plugged into corresponding receptacles of the base module 2. Here, the centering pins 12 each have a conical head. In principle, the centering pins 12 can also comprise latching elements and therefore can be additionally fixed in the corresponding receptacles of the base module 2 by latching.

Figure 2:
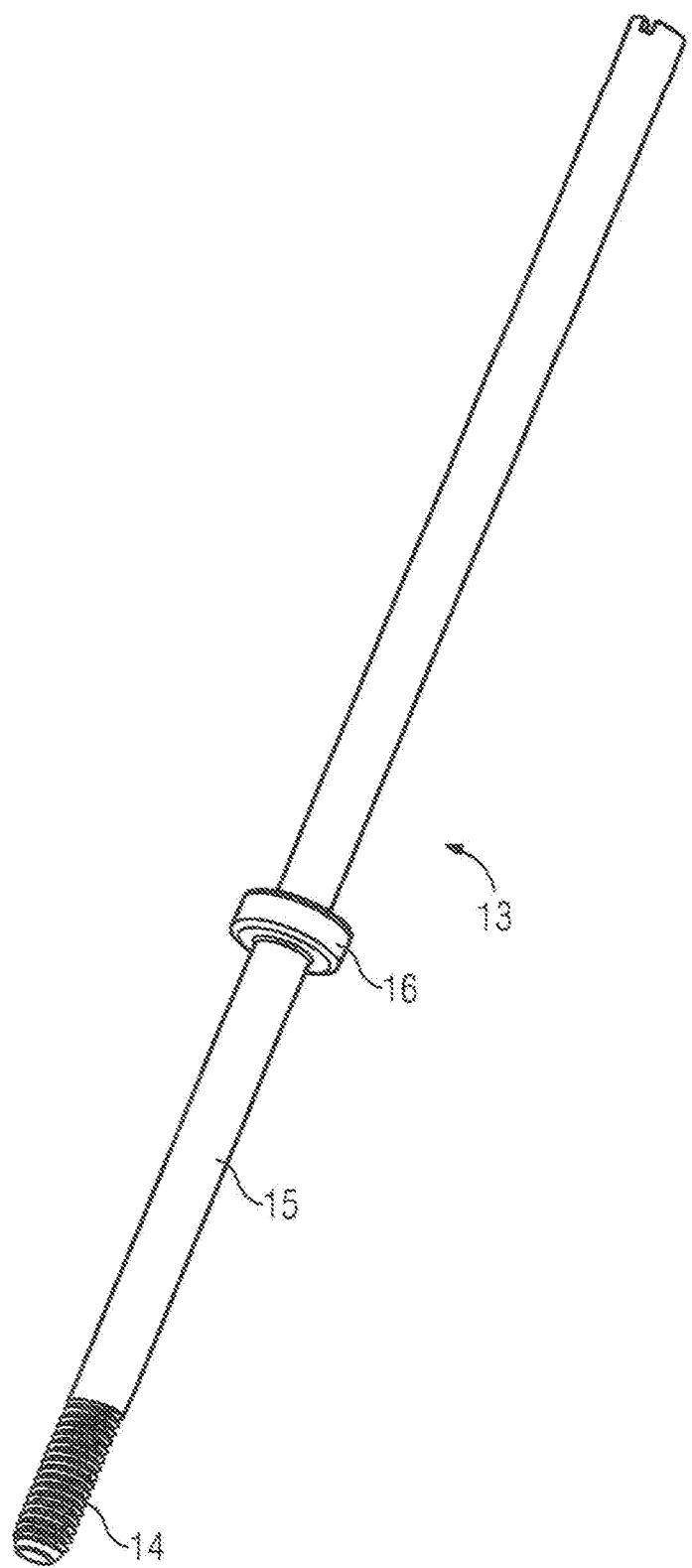
FIG. 2 shows a perspective illustration of a fastening screw of the communication module of FIG. 1.

A fastening screw 13 passes through the housing 11 of the communication module 1 between the centering pins 12 via a threaded section 14 (also see FIG. 2). In accordance with the sectional illustrations in FIGS. 3-5, the threaded section 14 of the fastening screw 13 can be screwed into a threaded bore on a housing 21 of the base module 2, such as via a screwdriver that is applied to a screw head. The centering pins 12 and the fastening screw 13 ensure correct and secure fitment and removal of the communication module 1.

A passage 17 for receiving the fastening screw 13 is arranged centrally in the housing 11 of the communication module. Here, the passage 17 extends perpendicularly to the connection region. A driver ring 16 that surrounds a section of a shaft 15 of the fastening screw 13 is connected to the fastening screw 13. The driver ring 16 is preferably connected in a rotationally fixed manner to the shaft of the fastening screw 13. For example, a knurled wheel for turning the fastening screw 13 can be integrally formed on the driver ring 16 for tool-free fitting and removal.

A cutout 18 for the driver ring 16 is provided in the housing 11 of the communication module along the passage 17. The driver ring 16 can be axially displaced inside this cutout 18, where axial ends of the cutout 18 each form a stop 19 for the driver ring 16 along the passage 17.

In accordance with the sectional illustrations in FIGS. 3-5, plug-in forces that are required when fitting the communication module 1 to the base module 2 by interlocking connection between the driver ring 16 and the housing 11 of the communication module 1 are transmitted to the housing 11 via the driver ring 16. In the fitted state, the fastening screw 13, via its threaded section 14, is turned completely into the threaded bore 22 on the housing 21 of the base module 2 (see FIG. 4).

Conversely, the fastening screw 13 is turned in the unscrewing direction during removal, such that the housing 11 of the communication module 1 is moved away from the housing 21 of the base module 2 via the driver ring 16 (see FIG. 5). The communication module 1 can then be removed from the base module 2 in a simple manner.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A communication module for a communication or automation device, comprising:
    a housing including a connection region which is brought into contact with a base module of the communication or automation device;
    at least two centering pins provided in the connection region which are insertable into corresponding receptacles of the base module;
    a fastening screw which passes through the housing between the at least two centering pins via a threaded section, the threaded section of the fastening screw be screwable into a threaded bore of the base module;
    a passage for receiving the fastening screw, said passage being arranged substantially centrally in the housing and extending perpendicularly to the connection region;
    a driver ring which is connected to the fastening screw and which surrounds a section of a shaft of the fastening screw; and
    a cutout for the driver ring, said cutout being provided in the housing along the passage and said driver ring being axially displaceable inside the cutout.

2. The communication module as claimed in claim 1, further comprising:
    multiple-pole plug-in connection elements provided in the connection region, said multiple-pole plug-in connection elements being connectable to corresponding plug-in connection elements on the base module.

3. The communication module as claimed in claim 1, wherein the at least two centering pins each have a conical head.

4. The communication module as claimed in claim 2, wherein the at least two centering pins each have a conical head.

5. The communication module as claimed in claim 1, wherein the at least two centering pins comprise latching elements and are latchable in the corresponding receptacles of the base module.

6. The communication module as claimed in claim 1, wherein the at least two centering pins comprise latching elements and are latchable in the corresponding receptacles of the base module.

7. The communication module as claimed in claim 3, wherein the at least two centering pins comprise latching elements and are latchable in the corresponding receptacles of the base module.

8. The communication module as claimed in claim 1, further comprising:
    a knurled wheel integrally formed on the driver ring for turning the fastening screw.

9. The communication module as claimed in claim 2, further comprising:
    a knurled wheel integrally formed on the driver ring for turning the fastening screw.

10. The communication module as claimed in claim 3, further comprising:
    a knurled wheel integrally formed on the driver ring for turning the fastening screw.

11. The communication module as claimed in claim 5, further comprising:
    a knurled wheel integrally formed on the driver ring for turning the fastening screw.

12. The communication module as claimed in claim 1, wherein the driver ring is connected in a rotationally fixed manner to the shaft of the fastening screw.

13. The communication module as claimed in claim 1, wherein axial ends of the cutout each form a stop for the driver ring along the passage.

14. The communication module as claimed in claim 1, wherein the housing comprises at least one transmitting and receiving unit which is configured in accordance with at least one of (i) a selected physical layer and (ii) a selected data link layer protocol.

* * * * *